US006498116B1

(12) United States Patent
Lehman et al.

(10) Patent No.: US 6,498,116 B1
(45) Date of Patent: Dec. 24, 2002

(54) COATING AND FILLER MATERIALS FOR USE IN LOCALIZED THERMAL PROCESSING OF GLAZED CERAMICS

(75) Inventors: Richard Long Lehman, South Brunswick, NJ (US); Yuya Umezu, Edison, NJ (US); Jie Li, Farmington, CT (US); Daniel Ely Murnick, Bernardsville, NJ (US); James Colaizzi, New Brunswick, NJ (US)

(73) Assignee: Rutgers, the State University, Piscataway, NJ (US)

( * ) Notice: Subject to any disclaimer, the term of this patent is extended or adjusted under 35 U.S.C. 154(b) by 0 days.

(21) Appl. No.: 09/564,277

(22) Filed: May 4, 2000

Related U.S. Application Data

(62) Division of application No. 09/226,946, filed on Jan. 8, 1999, now Pat. No. 6,127,005.

(51) Int. Cl.[7] .......................... C03C 8/20; C03C 3/118; C03C 3/072
(52) U.S. Cl. ............... 501/14; 501/15; 501/17; 501/18; 501/32; 501/61; 501/62; 501/75; 501/76
(58) Field of Search .............................. 501/14, 15, 17, 501/18, 32, 61, 62, 75, 76

(56) References Cited

U.S. PATENT DOCUMENTS

| | | | |
|---|---|---|---|
| 3,848,104 A | | 11/1974 | Locke |
| 4,135,038 A | * | 1/1979 | Takami et al. ............... 428/427 |
| 4,369,348 A | | 1/1983 | Stetson et al. |
| 4,405,722 A | * | 9/1983 | Kokubu et al. ............... 501/15 |
| 4,420,569 A | | 12/1983 | Tick |
| 4,562,332 A | | 12/1985 | Walter et al. |
| 4,710,479 A | * | 12/1987 | Yamanaka et al. ........... 501/15 |
| 4,996,172 A | | 2/1991 | Beall et al. |
| 5,071,795 A | | 12/1991 | Beall et al. |
| 5,075,261 A | * | 12/1991 | Yamanaka ................... 501/15 |
| 5,089,446 A | | 2/1992 | Cornelius et al. |
| 5,122,484 A | | 6/1992 | Beall et al. |
| 5,266,094 A | * | 11/1993 | Johansson et al. ............. 65/66 |
| 5,328,874 A | | 7/1994 | Beall et al. |
| 5,330,940 A | | 7/1994 | Aitken et al. |
| 5,393,482 A | | 2/1995 | Benda et al. |
| 5,427,825 A | | 6/1995 | Murnick |
| 5,468,694 A | * | 11/1995 | Taguchi et al. ................ 501/17 |
| 5,508,489 A | | 4/1996 | Benda et al. |
| 5,510,300 A | * | 4/1996 | Lim et al. ...................... 501/15 |
| 5,514,360 A | * | 5/1996 | Sleight et al. .............. 423/593 |
| 5,529,960 A | | 6/1996 | Aitken et al. |
| 5,529,961 A | | 6/1996 | Aitken et al. |
| 5,564,272 A | | 10/1996 | Warner et al. |
| 5,595,583 A | | 1/1997 | Murnick |
| 5,733,828 A | * | 3/1998 | Usui et al. .................... 501/17 |
| 5,762,675 A | * | 6/1998 | Malmqvist et al. ............. 65/66 |
| 5,916,832 A | * | 6/1999 | Tanabe et al. ................. 501/17 |
| 5,919,720 A | * | 7/1999 | Sleight et al. ............... 501/126 |
| 5,976,999 A | * | 11/1999 | Evans et al. .................... 501/1 |
| 6,183,716 B1 | * | 2/2001 | Sleight et al. .............. 423/593 |
| 6,187,700 B1 | * | 2/2001 | Merkel ........................ 501/32 |

* cited by examiner

*Primary Examiner*—Karl Group
(74) *Attorney, Agent, or Firm*—Duane Morris LLP

(57) ABSTRACT

Coating and filler materials for localized thermal processing of glazed ceramics and other brittle and low thermal conductivity materials. The coating materials include oxide compositions that exhibit coefficients of thermal expansion which are less than about $8 \times 10^{-6}/°$ C. and glass transition temperatures which are less than about 400° C. The filler materials include particulate oxide materials which do not substantially react during localized thermal processing of glazed ceramics and other brittle and low thermal conductivity materials. The coating and filler materials are useable together as a composite material for repairing cavities having depths greater than about 2 mm.

7 Claims, 7 Drawing Sheets

COATING AND FILLER MATERIALS FOR USE IN LOCALIZED THERMAL PROCESSING OF GLAZED CERAMICS

This applications is a divisional of U.S. application Ser. No. 09/226,946, filed Jan. 8, 1999, now U.S. Pat. No. 6,127,005.

FIELD OF THE INVENTION

This invention relates to localized thermal processing of glazed ceramics and other brittle and low thermal conductivity materials. More particularly, this invention relates to coating and filler materials for use in such processing, the coating materials having coefficients of thermal expansion of less than about $8 \times 10^{-6}/°$ C. and glass transition temperatures of less than about 400° C., and the filler materials having coefficients of thermal expansion of about $0.5 \times 10^{-6}/°$ C.

BACKGROUND OF THE INVENTION

Vitreous coating materials, commonly referred to as glazes or enamels, are used on many ceramics and other brittle and low thermal conductivity materials for aesthetic and functional purposes. Ceramic whitewares are coated with glazes for decorative and sanitary purposes. Conductive glazes are used on ceramic electrical insulators to remove charges. Glazes are also used in ceramic electronic packages for hermetic sealing and bonding. Enameled cast iron is coated with porcelain enamels for decorative and functional purposes.

Glazed ceramic manufacturing processes often yield a certain percentage of product that have surface defects. These defects can detract from the appearance of the article and create functional problems that render the article unusable. Consequently, methods have been developed for repairing certain types of surface defects in glazed ceramics. One such repair method involves enlarging the hole by drilling, filling the hole with a glaze material similar to the original, and re-firing the entire part at maximum temperatures near 1200° C. for many hours. Unfortunately, new flaws may initiate at secondary sites during re-firing, thus, frustrating the repair efforts. Moreover, this method is expensive, energy intensive, and time consuming.

Another repair method considered for use in repairing glazed ceramics is laser welding. Laser welding methods typically employ a carbon dioxide ($CO_2$) laser operating at a wavelength of 10.6 $\mu$m. Such lasers are used because they are stable and capable of delivering high, readily absorbed output power such that temperatures of 1800° C.–1900° C. over a few square millimeter area can be rapidly achieved to fuse refractory materials within a few seconds. The rapid heating can also produce undesirable cracking within and near the irradiated region due to the brittle and low thermal conductive nature of ceramics which permit high thermal gradients and high stresses to develop.

Laser induced thermal stress problems have been addressed in U.S. Pat. No. 5,427,825 which discloses a method for localized glazing of ceramics that maintains a non-destructive level of thermal stresses within the irradiated region by appropriate control of the laser's energy. This is accomplished by applying a fusing radiant energy to a fusion zone on the surface of the glazed ceramic article and annealing the fusion zone by applying annealing radiant energy to an annealing zone on the surface of the article which encompasses the fusion zone. The annealing radiant energy limits the thermal stress to a level during cooling which is less than the fracturing stress of the ceramic material, so that cooling can be accomplished without inducing cracks in the surface.

The glazes coating the ceramics described in U.S. Pat. No. 5,427,825 typically have melting temperatures near 1200° C., and coefficients of thermal expansion of $6-7 \times 10^{-6}/°$ C. The engineering of these two parameters has been found to be critical in laser fusion performance, particularly in laser sealing of vitreous coatings over brittle substrates. The high melting temperature requires the absorption of considerable energy to fuse the coating to the substrate. Consequently, the non-destructively high thermal gradients and the thermal expansions in the range noted, can still increase thermally-induced strains beyond critical limits, thus resulting in permanent damage to the coating and the substrate.

Accordingly, coating materials are needed which have coefficients of thermal expansion and glass transition temperatures sufficiently lowered to a point where the strain induced by a rapid change in temperature during localized thermal processing, remains below the elastic strain limit. There is also a need for filler materials that can be used for repairing deep defects via localized thermal processing.

SUMMARY OF THE INVENTION

The present invention relates to coating and filler materials for localized thermal processing of glazed ceramics and other brittle and low thermal conductivity materials. The coating materials comprise oxide compositions that exhibit coefficients of thermal expansion which are less than about $8 \times 10^{-6}/°$ C. and glass transition temperatures which are less than about 400° C. The filler materials comprise particulate oxide materials which do not substantially react during localized thermal processing of glazed ceramics and other brittle and low thermal conductivity materials.

The coating and filler materials are useable together as a composite material for repairing cavities having depths greater than about 2 mm.

BRIEF DESCRIPTION OF THE DRAWINGS

The advantages, nature and various additional features of the invention will appear more fully upon consideration of the illustrative embodiments described in detail below, considered together with the accompanying drawings. In the drawings.

It should be understood that the drawings are for purposes of illustrating the concepts of the invention and are not to scale.

DETAILED DESCRIPTION OF THE INVENTION

Coating and filler materials of the present invention are made from compositions comprising the following oxides in mole percent: 0–5.0% $Al_2O_3$, 3.6–47.4% $B_2O_3$, 0–0.11% CaO, 0–0.11% $Fe_2O_3$, 0–8.0% $K_2O$, 0–38.0% $Li_2O$, 0–11.1% $LiNO_3$, 0–10.0% $Na_2O$, 1.1–45.0% PbO, 2.0–86.5% $SiO_2$, 0–30.0% $SnO_2$, 0–38.0% ZnO, and 0–7.0% $ZrW_2O_8$.

In the coating materials, the oxides $Al_2O_3$, $B_2O_3$, and $SiO_2$ operate as glass formers and the oxides $K_2O$, $Li_2O$, $Na_2O$, PbO, and ZnO operate as modifiers or to lower the melting point of the coating materials. The PbO also lowers the viscosity and improves the flow property of the coating materials.

Figure 1:
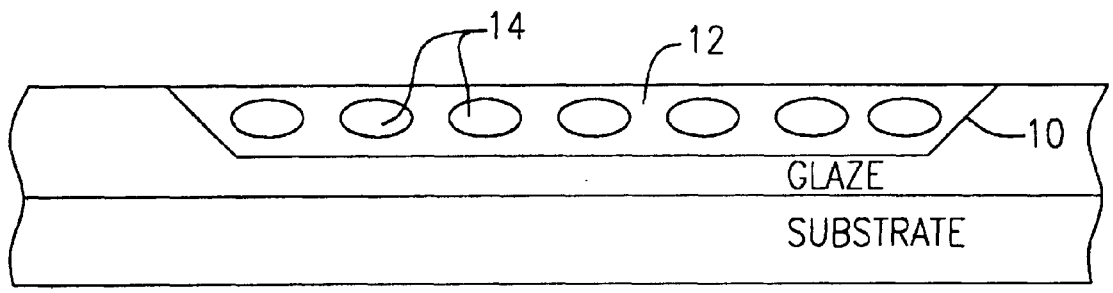
FIG. 1 is a schematic representation of the coating material of the present invention.

Referring to FIG. 1, each coating material of the present invention defines a microcomposite system 10 comprised of a low coefficient of thermal expansion constituent phase 14 finely intertwined with a low glass transition temperature ($T_g$) constituent phase 12. The combination of these two different phases 12, 14 on a microscopic scale relieves stresses during localized thermal processing on a microscopic scale by developing micro-cracks (not resolvable to the naked eye), which will substantially prevent the appearance of visible cracks.

The coating materials of the present invention have low coefficients of thermal expansion (CTE) of less than about $8 \times 10^{-6}/°$ C. and typically less than about $4 \times 10^{-6}/°$ C. The $T_g$s of the coating materials are less than about 400° C. and typically less than 300° C. This makes them especially useful for localized thermal processing of glazed ceramics, enameled cast iron, and other low thermal conductivity brittle solid materials. The low CTE produces a permanent residual strain ($\epsilon$) in the coating which is below the elastic strain limits of the constrained expansion environment that characterizes localized thermal processing of low thermal conductivity brittle solid materials. The low $T_g$ also contributes to the sufficiently low residual strain $\epsilon$ in the coating because of the temperature differential between $T_g$ and the ambient temperature ($T_a$). In particular, the general relationship between permanent residual strain $\epsilon$ in the coating and the differential between $T_g$ and $T_a$ is:

$$\epsilon \cong (CTE_{substrate} - CTE_{coating})(T_g - T_a)$$

Figure 2:
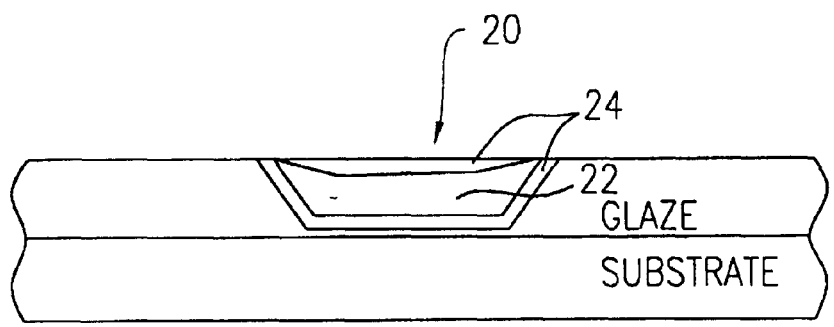
FIG. 2 is a schematic representation of the composite repair material of the present invention.

The filler material compositions are used with the coating materials to form composite repair materials for repairing cavities and holes having depths greater than 2 mm. FIG. 2 shows such a composite repair material designated by numeral 20. The composite repair material 20 includes a filler material 22 used as an inert base coat material under a microcomposite coating material 24. A microcomposite coating material 24 is also required at the bottom of the filler material 22 to bond the filler material to the cavity.

The coating and filler material compositions can be made by heating together a combination of component oxides or compounds which transform into the desired oxides. Table I, below, sets forth two preferred glass frit materials, LR-7 and CF7556, and a ceramic crystalline powder material, L2122, which can be used for making the component oxides. The oxides in these materials are set forth in mole percents.

TABLE 1

| Oxide | LR-7 | CF7556 | L2122 |
|---|---|---|---|
| $Al_2O_3$ | 0.0 | 5.2 | 17.6 |
| $B_2O_3$ | 21.0 | 38.1 | 0.0 |
| CaO | 0.0 | 0.0 | 0.11 |
| $Fe_2O_3$ | 0.0 | 0.0 | 0.1 |
| $K_2O$ | 0.0 | 0.0 | 0.0 |
| $Li_2O$ | 22.0 | 0.0 | 4.5 |
| $Na_2O$ | 0.0 | 0.0 | 0.2 |
| PbO | 21.0 | 41.9 | 0.0 |
| $SiO_2$ | 36.0 | 7.0 | 77.5 |
| $SnO_2$ | 0.0 | 0.0 | 0.0 |
| ZnO | 0.0 | 7.8 | 0.0 |
| $ZrW_2O_8$ | 0.0 | 0.0 | 0.0 |
| $LiNO_3$ | 0.0 | 0.0 | 0.0 |

The LR-7 glass frit listed in Table I has a CTE of about $9.5 \times 10^{-6}/°$ C. and a $T_g$ estimated at about 350° C. LR-7 glass frit has a clear color and a low viscosity which provides it with excellent flow properties due to the PbO contained therein. The LR-7 glass frit can be utilized as a bonding agent in inert base coatings used for filling deep repairs. The LR-7 glass frit can also be employed as a low $T_g$ constituent in coatings used for repairing surface defects in flat and curved surfaced glazed articles, very shallow holes (less than 2 mm in depth) such as those created when drilling out surface specks, and as a top coating in composite coating repair materials.

The following raw materials, provided in weight percent, can be used for making the LR-7 glass frit: 7.33% $Li_2O$, 16.29% $B_2O_3$, 24.12% $SiO_2$, and 52.25% PbO. The $Li_2O$, PbO, $B_2O_3$ are respectively supplied as $Li2CO_3$ and $2PbO \cdot B_2O_3$ (the remaining balance of $B_2O_3$ is supplied as boron oxide). The $SiO2$ is supplied as quartz powder that is commercially available under the tradename Supersil® from U.S. Silica Company. The LR-7 glass frit can also be made using the following raw materials in weight %: 21.27% $SiO_2$, 12.70% $Li_2CO_3$, 52.68% $2PbO \cdot B_2O_3$, 7.25% $B_2O_3$, and 6.10% $LiNO_3$. As a material, the $LiNO_3$ is used as an oxidizing agent to prevent darkening, thereby improving the color matching abilities of the coating. The remaining $Li_2O$ in the final composition is supplied by the $Li_2CO_3$.

The raw materials are melted in a covered silica crucible with an electric furnace (air atmosphere) heated at a rate of 600° C./hour to about 850° C. for 0.5 hours, and then cooled to room temperature. The LR-7 glass frit is separated from the crucible and crushed manually into powder form with a mortar and pestle so that it passes a 200 mesh sieve.

The CF7556 glass frit of Table I is commercially available from Ferro Corp. CF7556 has a CTE of about $6.7 \times 10^{-6}/°$ C., a $T_g$ of about 330° C., and a faint yellow color. The CF7556 glass frit can be employed as a low $T_g$ constituent in coatings used for repairing surface defects in flat and curved surfaced glazed articles.

The L2122 ceramic crystalline powder of Table I is commerically available from Lithafrax Powders, Pakco Industrial Ceramics, Ind. This material has a CTE of less than about $0.2 \times 10^{-6}/°$ C. The L2122 ceramic crystalline powder can be employed as a low CTE constituent in coatings used for repairing surface defects in flat and curved surfaced glazed articles and repairing very shallow holes in glazed articles.

The preferred additive materials used in the material compositions of the present invention include $SnO_2$, $ZrW_2O_8$, $LiNO_3$, finely ground fused silica and alumina. $SnO_2$ operates as an opacifier in the coating compositions for whitening and color matching. The $LiNO_3$ operates as an oxidizing agent for minimizing darkening of the LR-7 and CF7556 glass frits during localized thermal processing. The $ZrW_2O_8$ is a negative CTE material ($-4.9 \times 10^{-6}/°$ C.) that is added to the LR-7 or CF7556 glass frits in order to reduce the effective CTE of the composition. The fused silica and alumina are used in the compositions for making the filler materials.

Prior to mixing, the glass frits, the ceramic powders, and the additive materials (both in powder form) are separately processed to reduce their particle sizes. This can be accomplished by ball milling with zirconia milling media for about 24 hours in a 500 ml Nalgene plastic bottle using distilled, deionized, and demineralized water. The milling media is then removed and sedimentation is performed to remove particles greater than 10 microns equivalent spherical diameter. The non-settled powder is then dried in a 90° C. oven and crushed with a mortar and pestle to break up agglomerates. When the $LiNO_3$ is used as an additive to the powders, the particle size is not reduced since it dissolves in the water used for mixing the powder materials.

Once reduced to the appropriate particle size, the glass frit and the ceramic additive powders are mixed in proportions which meet the oxide parameters of the composition. Mixing can be accomplished by ball milling for about 1 hour in distilled, deionized, and demineralized water and drying the mixture. The mixture is then crushed with a mortar and pestle to remove agglomerates.

Mixing can also be accomplished by melting the glass frit and additive powders in a covered silica crucible, in air, with an electric furnace heated at a rate of 600° C./hour to about 850° C. for 0.5 hours, and then cooling to room temperature. The mixture is separated from the crucible and crushed manually into powder form with a mortar and pestle so that it passes a 200 mesh sieve. The particle size of the mixture is reduced by ball milling with zirconia milling media for about 24 hours in a 500 ml Nalgene plastic bottle using distilled, deionized, and demineralized water. The milling media is then removed and sedimentation is performed to remove particles greater than 10 microns equivalent spherical diameter. The non-settled mixture is then dried in a 90° C. oven and crushed with a mortar and pestle to break up agglomerates.

Table II, below, sets forth preferred coating compositions that are very useful for repairing surface defects on flat and curved surfaced glazed articles and very shallow holes in glazed articles using localized thermal processing methods. The oxides in the compositions are expressed in mole and weight percents. The constituent materials (LR-7, CF 7556, $ZrW_2O_8$, etc.) used in making the oxides of these compositions are expressed in weight percent.

TABLE II

| Oxide | Constituent materials: 50 wt % LR-7 20 wt % $SnO_2$ 30 wt % L2122 | | Constituent materials: 50 wt % LR-7 10 wt % $SnO_2$ 40 wt % 2122 | | Constituent materials: 65 wt % LR-7 15 wt % $SnO_2$ 20 wt % $ZrW_2O_8$ | | Constituent materials: 58.6 wt % CF7556 34.4 wt % $SnO_2$ 7 wt % $LiNO_3$ | |
|---|---|---|---|---|---|---|---|---|
| | Mole % | Wt % | Mole % | Wt % | Mole % | Wt % | Mole % | Wt % |
| $Al_2O_3$ | 3.5 | 5.3 | 4.4 | 7.0 | 0.0 | 0.0 | 3.3 | 3.0 |
| $B_2O_3$ | 0.0 | 0.0 | 9.5 | 10.5 | 15.6 | 13.7 | 35.0 | 22.3 |
| CaO | 0.0 | 0.0 | 0.0 | 0.0 | 0.0 | 0.0 | 0.0 | 0.0 |
| $Fe_2O_3$ | 0.0 | 0.0 | 0.0 | 0.0 | 0.0 | 0.0 | 0.0 | 0.0 |
| $K_2O$ | 0.0 | 0.0 | 0.0 | 0.0 | 0.0 | 0.0 | 0.0 | 0.0 |
| $Li_2O$ | 27.9 | 12.4 | 27.1 | 12.8 | 38.0 | 14.3 | 0.0 | 0.0 |
| $Na_2O$ | 0.1 | 0.1 | 0.1 | 0.1 | 0.0 | 0.0 | 0.0 | 0.0 |
| PbO | 3.2 | 10.5 | 3.0 | 10.5 | 4.9 | 13.7 | 12.0 | 24.5 |
| $SiO_2$ | 46.3 | 41.3 | 51.6 | 49.0 | 30.9 | 23.4 | 7.5 | 4.1 |
| $SnO_2$ | 8.9 | 20.0 | 4.2 | 10.0 | 7.9 | 15.0 | 25.0 | 34.4 |
| ZnO | 0.0 | 0.0 | 0.0 | 0.0 | 0.0 | 0.0 | 6.2 | 4.6 |
| $ZrW_2O_8$ | 0.0 | 0.0 | 0.0 | 0.0 | 2.7 | 20.0 | 0.0 | 0.0 |
| $LiNO_3$ | 0.0 | 0.0 | 0.0 | 0.0 | 0.0 | 0.0 | 11.1 | 7.0 |

The $SnO_2$ whitening agent and the L2122 ceramic crystalline powder or $ZrW_2O_8$ low CTE constituents (for reducing the overall CTE of the coating) are added to the LR-7 or CF7556 glass frits for optimizing the microcomposite. The $LiNO_3$ oxidizing agent is added to the CF7556 glass frit to prevent darkening during localized thermal processing.

Figure 3:
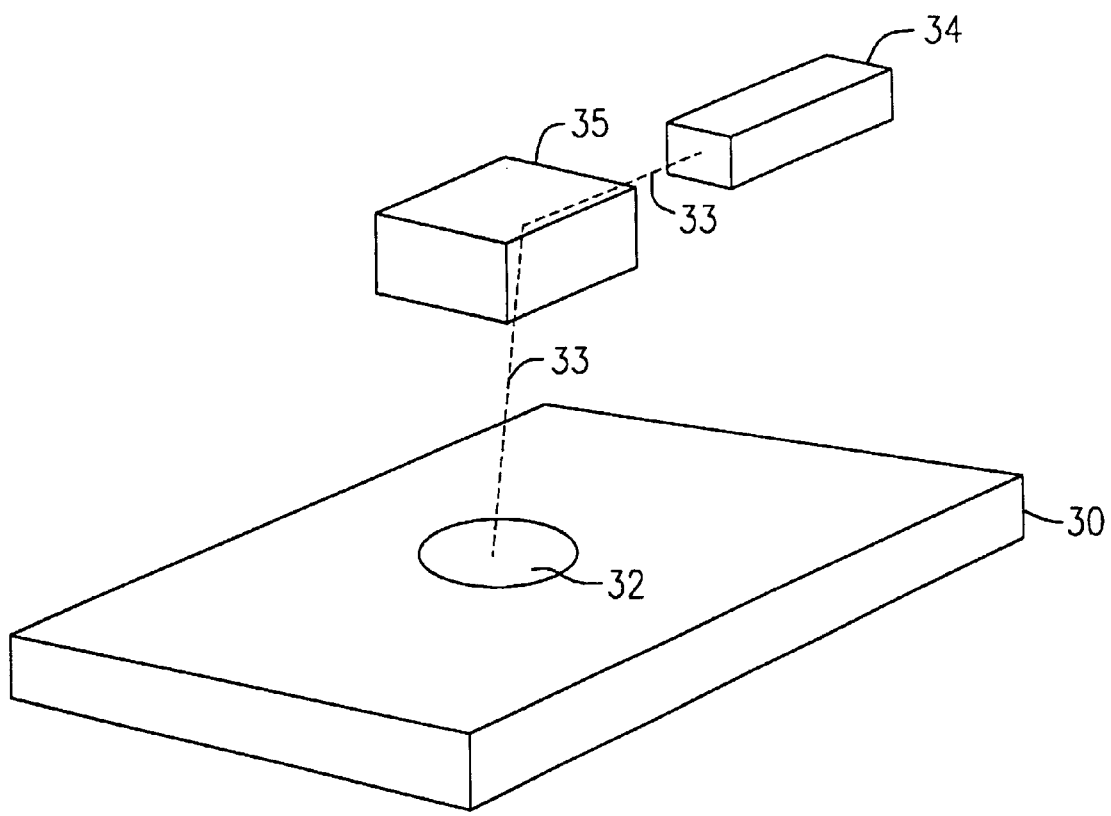
FIGS. 3 and 4 are schematic representations illustrating the use of the coating materials of the present invention in repairing various surface defects in glazed articles using thermal processing methods.

Referring to FIG. 3, surface defects in flat and curved surfaced glazed articles (flat surface shown) are typically repaired by applying an approximately 0.05 mm thick layer 32 of any of the Table II coating materials onto the glazed surface of an article 30 to be repaired. The layer 32 of coating material is then fused using any well known localized contact or non-contact heating/thermal processing method.

Figure 4:
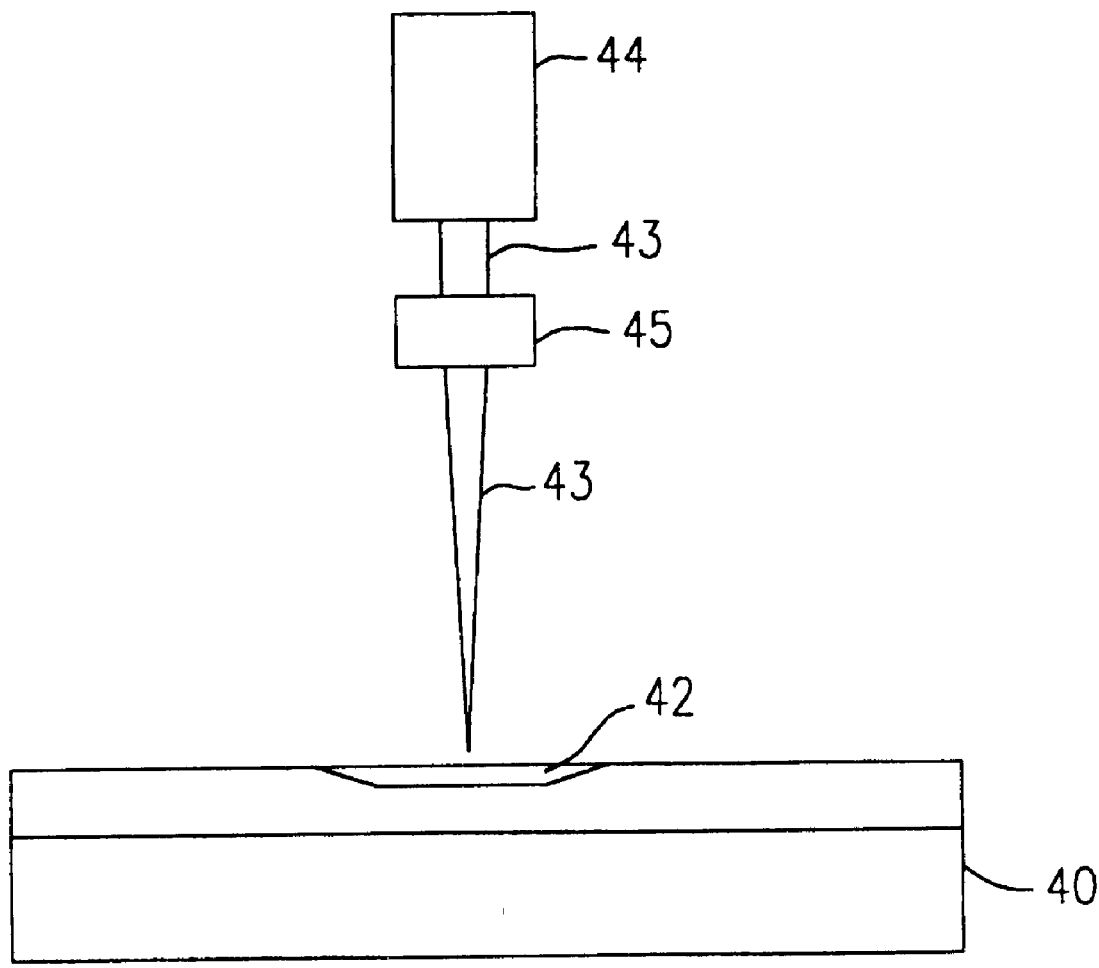

Referring to FIG. 4, all three LR-7 based Table II coating materials are also useful for repairing shallow holes or cavity of less than about 2 mm in depth in glazed articles. This is typically accomplished by dispensing coating material 42 into the hole or cavity of an article 40 to be repaired. The coating material 42 is then fused using a thermal processing method.

The second and third LR-7 based Table II coating materials (50 LR-7+10 $SnO_2$+40 L2122 and 65 LR-7+15 $SnO_2$+ 20 $ZrW_2O_8$) are further useful for masking iron defects in glazed articles. These type of repairs are performed by applying about a 0.5mm thick layer of the coating material onto the surface of the article to be repaired and fusing it using a thermal processing method.

Table III, below, sets forth preferred filler material compositions for composite repair materials. The oxides in the formulations are expressed in mole and weight percents. The constituent materials (LR-7 and fused silica) used in making the oxides of these compositions are expressed in weight percent.

TABLE III

| Oxide | Constituent materials: 80 wt % Fused silica 20 wt % LR-7 | | Constituent materials: 70 wt % Fused silica 30 wt % LR-7 | |
|---|---|---|---|---|
| | Mole % | Wt % | Mole % | Wt % |
| $Al_2O_3$ | 0.0 | 0.0 | 0.0 | 0.0 |
| $B_2O_3$ | 3.6 | 4.2 | 5.4 | 6.3 |
| CaO | 0.0 | 0.0 | 0.0 | 0.0 |
| $Fe_2O_3$ | 0.0 | 0.0 | 0.0 | 0.0 |
| $K_2O$ | 0.0 | 0.0 | 0.0 | 0.0 |
| $Li_2O$ | 8.8 | 4.4 | 13.1 | 6.6 |
| $Na_2O$ | 0.0 | 0.0 | 0.0 | 0.0 |

TABLE III-continued

|  | Constituent materials: 80 wt % Fused silica 20 wt % LR-7 | | Constituent materials: 70 wt % Fused silica 30 wt % LR-7 | |
| --- | --- | --- | --- | --- |
| Oxide | Mole % | Wt % | Mole % | Wt % |
| PbO | 1.1 | 4.2 | 1.7 | 6.3 |
| $SiO_2$ | 86.5 | 87.2 | 79.8 | 80.8 |
| $SnO_2$ | 0.0 | 0.0 | 0.0 | 0.0 |
| ZnO | 0.0 | 0.0 | 0.0 | 0.0 |
| $ZrW_2O_8$ | 0.0 | 0.0 | 0.0 | 0.0 |
| $LiNO_3$ | 0.0 | 0.0 | 0.0 | 0.0 |

The LR-7 glass frit in the Table III filler material compositions bonds the inert fused silica particles together. In particular, the amount of the LR-7 added to the fused silica is small enough to prevent the darkening often caused by the LR-7 but, sufficient to melt and bond the individual fused silica particles together during localized thermal processing. Due to the comparatively low processing temperatures associated with localized thermal processing (less than 1000° C.), fused silica does not react during processing but stays in place to serve as filler. The LR-7 glass frit serves the same purpose in filler material compositions using alumina instead of fused silica.

Table IV, below, sets forth a preferred coating material composition that is very useful for covering specks on the glazed articles using localized thermal processing methods. This coating material composition is also very useful as a top coating in composite coatings. The oxides are expressed in mole and weight percents. The constituent materials (LR-7, CF 7556, $ZrW_2O_8$, etc.) used in making the oxides of these compositions are expressed in weight percent.

TABLE IV

|  | 63 CF7556 7 $SnO_2$ 30 $ZrW_2O_8$ | |
| --- | --- | --- |
| Oxide | Mole % | Wt % |
| $Al_2O_3$ | 4.4 | 3.3 |
| $B_2O_3$ | 47.4 | 24.0 |
| CaO | 0.0 | 0.0 |
| $Fe_2O_3$ | 0.0 | 0.0 |
| $K_2O$ | 0.0 | 0.0 |
| $Li_2O$ | 0.0 | 0.0 |
| $Na_2O$ | 0.0 | 0.0 |
| PbO | 16.3 | 26.4 |
| $SiO_2$ | 10.1 | 4.4 |
| $SnO_2$ | 6.4 | 7.0 |
| ZnO | 8.4 | 4.9 |
| $ZrW_2O_8$ | 7.0 | 30.0 |
| $LiNO_3$ | 0.0 | 0.0 |

Referring again to FIG. 2, deep cavities on the order of about 2 to 5 mm in depth can be repaired by first coating the base of the cavity with a coating material (preferably the Table IV coating material). Next, the cavity is filled with filler material (such as in Table III) and the materials are dried using thermal processing methods. The top surface of the filler material is smoothed and a coating material (preferably the Table IV coating material) is applied over the filler material. The coating material is fused using thermal processing methods thereby forming a rough patch surface. A second thin layer of coating material (on the order of about 0.5 mm) is applied and fused using thermal processing to smooth the surface of the repair.

All the repairs described above are smooth and well-bonded and can be accomplished in about 3 or less minutes.

The coating and filler materials of the present invention can be processed using any well known localized contact or non-contact heating/thermal processing method. However, the advantages of the inventive materials are best realized when thermally processed in accordance with the methods and apparatus described in U.S. Pat. No. 5,427,825, U.S. Pat. No. 5,595,583, and Y. Umezu et al., Localized Surface Modification of Low Thermal Conductivity brittle solids, Whitewares Division, Paper No. WME-017–97, presented at the 99th Annual Meeting of the American Ceramic Society, Cincinnati, Ohio, May 5, 1997, which are incorporated herein by reference. In these references, and as shown in FIGS. 3 and 4, an industrial $CO_2$ laser 34, 44 provides thermal energy (laser beam 33, 43) and a beam positioning/rastering system 35, 45 directs the laser beam 33, 43 to melt, fuse, and process the coating/filler material 32, 42 and the work piece 30, 40. A customized laser algorithm controls thermal gradients by changing the power of the laser beam 33, 43 in time and space. This can be accomplished by moving the laser beam 33, 43 in a spiral trajectory and varying the spiral diameter of the beam with time (rastering) to control the thermal gradient during heating and cooling and thereby prevent thermally induced cracking. The laser beam 33, 43 is controlled to move in a spiral path at a speed of 30 rotations/second. The spiral diameter starts out large, is decreased in diameter to raise the heat intensity at the work site, and is then increased in diameter for cooling. Alternatively, the spiral diameter may stay fixed and laser power increased to raise heat intensity at the work site. Cooling can then be accomplished by decreasing the laser power. The beam positioning system 35, 45 directs the laser beam 33, 43 in virtually any direction thus, enabling the coating/filler material 32, 42 and the workpiece 30, 40 to be localized thermally processed in variety of ways.

The coating and filler materials of the present invention are especially useful for repairing spot or line defects on porcelain ceramic sanitaryware. Moreover, any high-value material manufacturing process which generates surface defects late in the process will benefit from the inventive materials. For example, surface defects on expensive large high-tension porcelain electrical insulators or fine china can be locally repaired using the coating and filler materials of the present invention.

The coating materials of the present invention can also be used for decorating or laser writing complex shapes and patterns on fine china and glass using the methods and apparatus disclosed in U.S. Pat. Nos. 5,427,825 and 5,595,583, and Y. Umezu et al. This can be accomplished by applying a coating material on the surface of part and selectively fusing portions of the coating material with appropriate laser heating protocols.

Figure 5A:
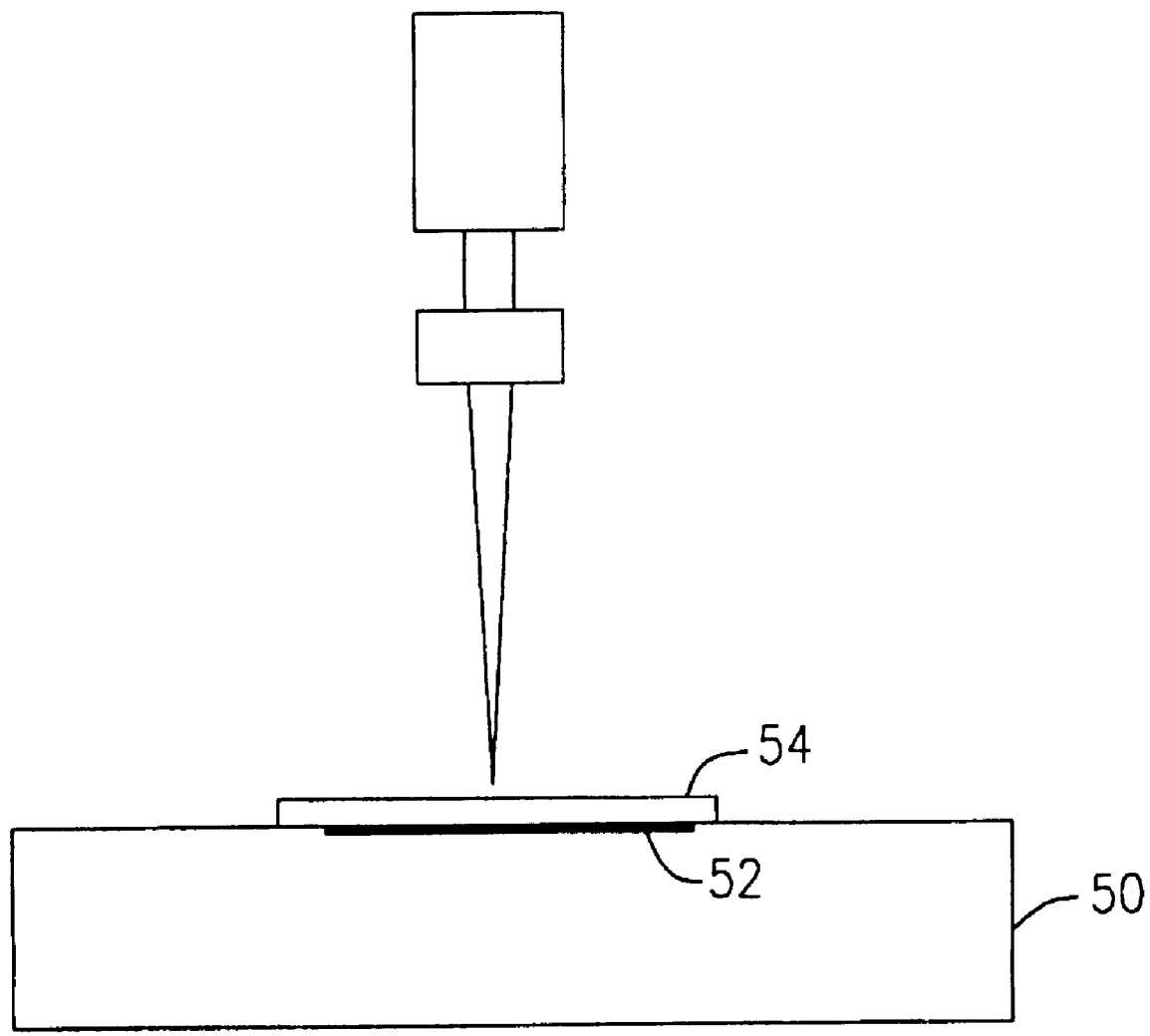
FIGS. 5A and 5B are schematic representations illustrating the use of the coating materials of the present invention as a bonding agent for attaching a silicon chip onto a substrate using localized thermal processing.
Figure 5B:
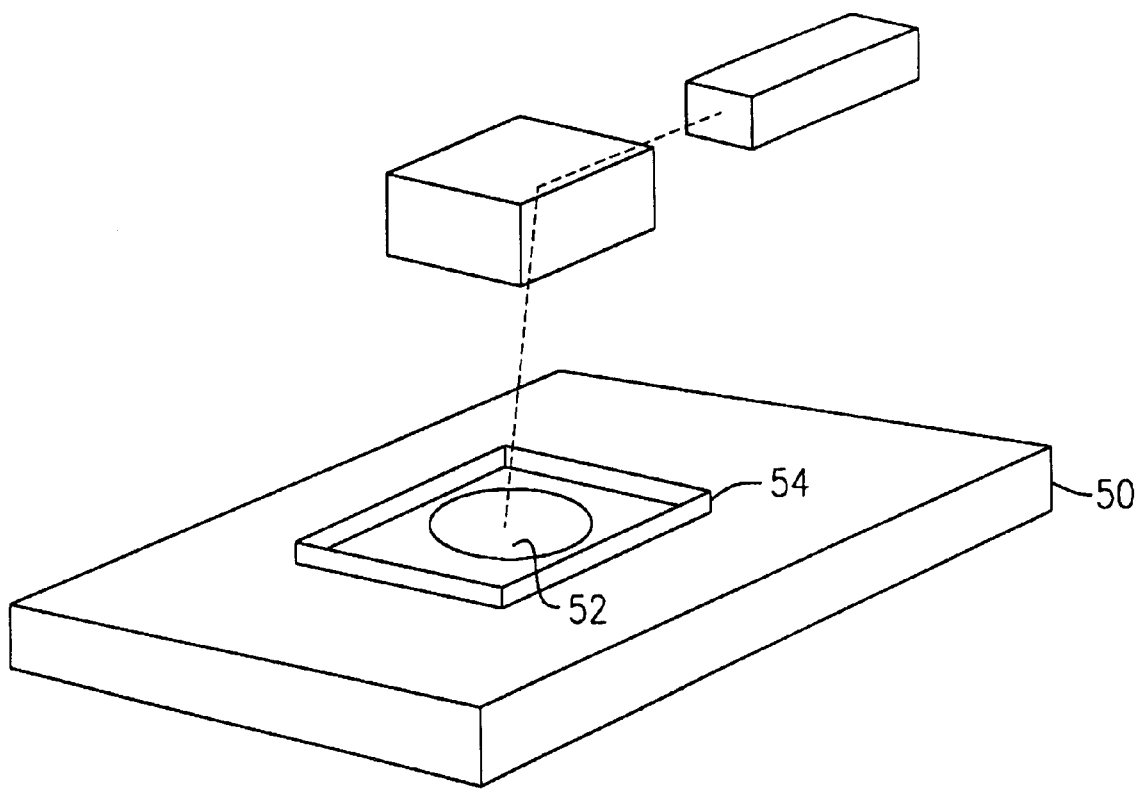

Bonding applications such as found in the field of electronic and electro-optic packaging can also benefit from the coating materials of the present invention. In particular, as shown in FIGS. 5A and 5B, the inventive coating materials can be used as a bonding agent 52 for attaching a silicon chip 54 onto a substrate 50 using localized thermal processing.

The coating materials of the present invention can also be used for sealing intricate, delicate assemblies and cathode ray tubes (not shown) using localized thermal processing methods without subjecting the entire assembly to high temperatures.

Figure 6A:
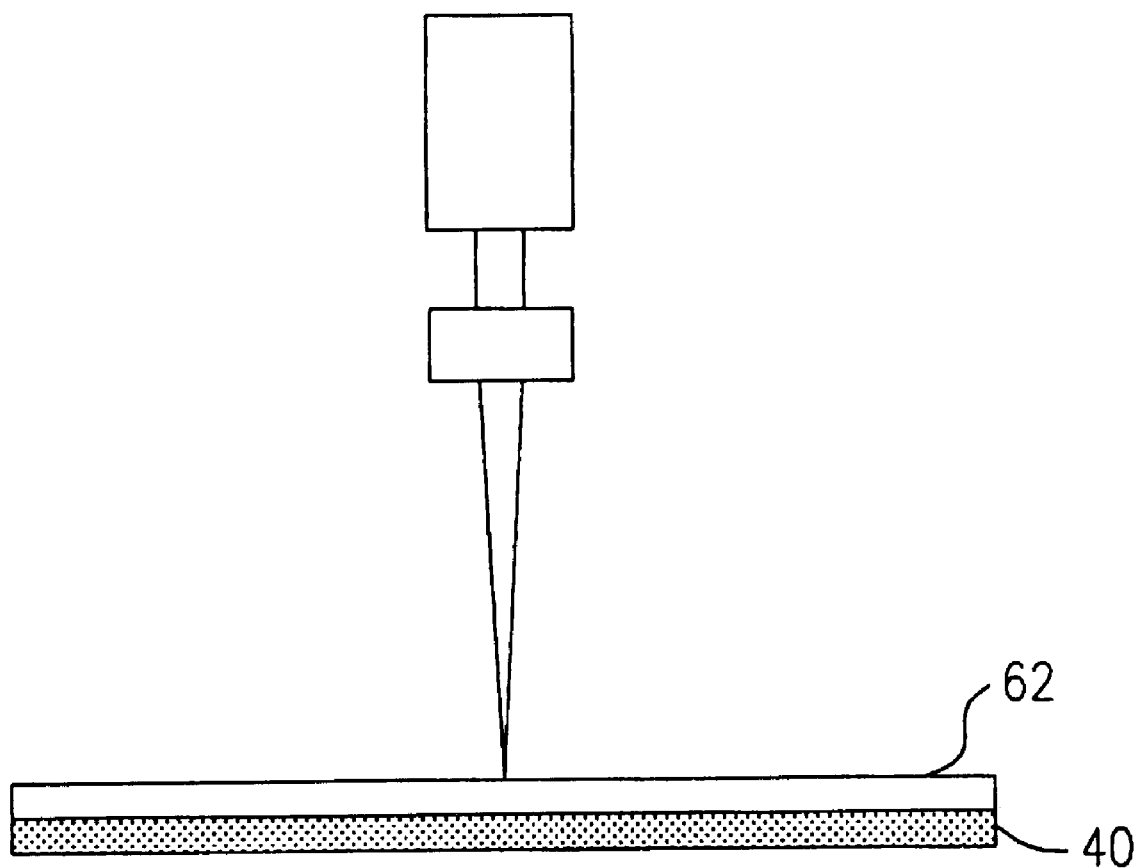
FIGS. 6A and 6B are schematic representations illustrating the use of the coating materials of the present invention as a bonding agent for attaching a ceramic superconductor to a metallic conductive substrate.
Figure 6B:
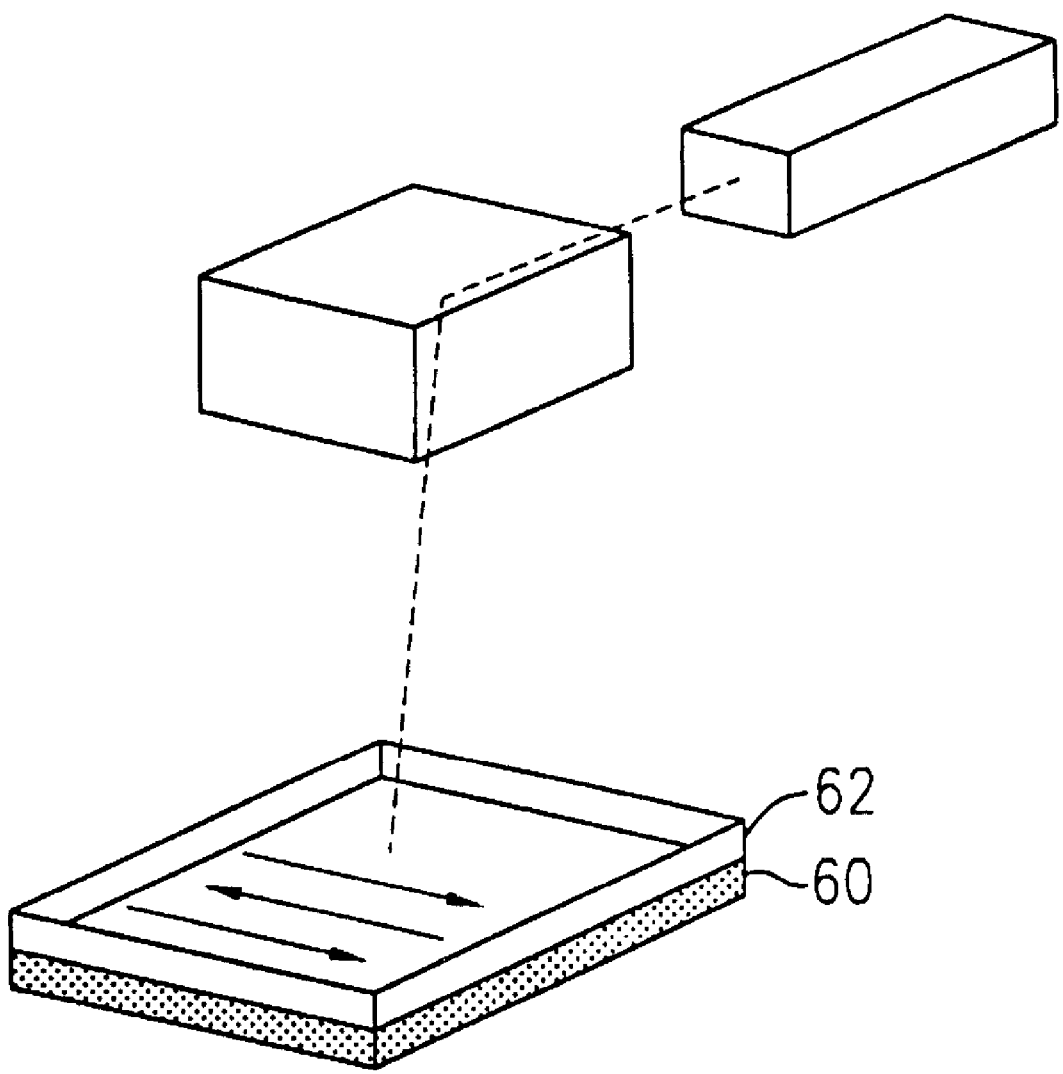

Ceramic superconductors and other superconducting materials can be melted and fused onto a metallic conductive substrate, such as silver, to form a ceramic superconducting wire using localized thermal processing and the coating materials of the present invention. FIGS. 6A and 6B show a ceramic superconductor 62 being bonded to a metallic conductive substrate 60 with a coating material of the present invention (not visible) using a rastered laser beam. The use of localized thermal processing promotes preferred crystal growth, a key element in producing maximum conduction properties. Localized thermal processing is also effective in controlling the reaction rates and stoichiometry of the superconducting materials by customizing the thermal profiles at desired locations of a process zone.

While the foregoing invention has been described with reference to the above embodiments, various modifications and changes may be made without departing from the spirit of the present invention. Accordingly, modifications and changes such as those suggested above but not limited thereto are considered to be within the scope of the claims.

What is claimed is:

1. A coating material for localized thermal processing of glazed ceramics and other brittle and low thermal conductivity materials, the coating material is made from a composition consisting essentially in mole percent of 3.3–5.0% $Al_2O_3$, 3.6–47.4% $B_2O_3$, 0–0.11% CaO, 0–0.11% $Fe_2O_3$, 0–8.0% $K_2O$, 0–38.0% $Li_2O$, 0–11.1% $LiNO_3$, 0–10.0% $Na_2O$, 1.1–45.0% PbO, 2.0–86.5% $SiO_2$, 0–30.0% $SnO_2$, 0–38.0% ZnO, and as a low CTE material 0–7.0% $ZrW_2O_8$, the coating material exhibiting a coefficient of thermal expansion of less than about $8\times10^{-6}/°$ C. and glass transition temperature of less than about 400° C.

2. A coating material is made from a composition consisting essentially in mole percent of 3.3–5.0% $Al_2O_3$, 3.6–47.4% $B_2O_3$, 0–0.11% CaO, 0–0.11% $FE_2O_3$, 0–8.0% $K_2O$, 0–38.0% $Li_2O$, 0–11.1% $LiNO_3$, 0–10.0% $Na_2O$, 1.1–45.0% PbO, 2.0–86.5% $SiO_2$, 0–30.0% $SnO_2$, 0–38.0% ZnO, and as a low CTE material 0–7.0% $ZrW_2O_8$, the coating material exhibiting a coefficient of thermal expansion of less than about $8\times10^{-6}/°$ C. and glass transition temperature of less than about 400° C.

3. The coating material according to claim 1, wherein the coating material defines a microcomposite including a material phase having a coefficient of thermal expansion less than about $8\times10^{-6}/°$ C. finely intertwined with a material phase having a glass transition temperature less than about 400° C.

4. The coating material according to claim 1, wherein the coating material is useful in repairing cosmetic defects appearing on whitewares using localized thermal processing.

5. The coating material according to claim 1, wherein the coating material includes at least one color forming pigment for use in decorating ceramics and other brittle and low thermal conductivity materials using localized thermal processing.

6. The coating material according to claim 1, wherein the coating is useful as a bonding agent for bonding electronic and opto-electronic devices using localized thermal processing.

7. The coating material according to claim 1, wherein the coating is useful in glazed metal systems.

* * * * *